United States Patent
Baek et al.

(10) Patent No.: US 9,136,135 B2
(45) Date of Patent: Sep. 15, 2015

(54) METHOD OF FABRICATING SEMICONDUCTOR DEVICE

(71) Applicant: Samsung Electronics Co., Ltd., Suwon-Si, Gyeonggi-Do (KR)

(72) Inventors: Jae-Jik Baek, Seongnam-si (KR); Ji-Hoon Cha, Seoul (KR); Bo-Un Yoon, Seoul (KR); Kwang-Wook Lee, Seongnam-si (KR); Jeong-Nam Han, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 23 days.

(21) Appl. No.: 13/944,087

(22) Filed: Jul. 17, 2013

(65) Prior Publication Data

US 2014/0080296 A1    Mar. 20, 2014

(30) Foreign Application Priority Data

Sep. 18, 2012  (KR) .................. 10-2012-0103418

(51) Int. Cl.
*H01L 21/306* (2006.01)
*H01L 21/8234* (2006.01)
*H01L 21/8238* (2006.01)
*H01L 29/78* (2006.01)
*H01L 29/66* (2006.01)

(52) U.S. Cl.
CPC .... *H01L 21/30604* (2013.01); *H01L 21/30608* (2013.01); *H01L 21/823412* (2013.01); *H01L 21/823425* (2013.01); *H01L 21/823807* (2013.01); *H01L 21/823814* (2013.01); *H01L 29/66628* (2013.01); *H01L 29/7833* (2013.01); *H01L 29/7848* (2013.01)

(58) Field of Classification Search
CPC ............... H01L 21/823412; H01L 21/823425; H01L 21/30604; H01L 21/823814; H01L 21/30608; H01L 21/823807; H01L 29/66636; H01L 29/165
USPC .......... 438/585, 151, 300, 299, 197; 257/E21.561, E27.112, E21.409, 257/E21.255, 192
See application file for complete search history.

(56) References Cited

U.S. PATENT DOCUMENTS

| | | | |
|---|---|---|---|
| 7,755,144 B2 * | 7/2010 | Li et al. ..................... | 257/368 |
| 7,791,064 B2 | 9/2010 | Shimamune et al. | |
| 7,851,313 B1 | 12/2010 | Luo et al. | |
| 7,955,936 B2 | 6/2011 | Tan et al. | |

(Continued)

FOREIGN PATENT DOCUMENTS

| | | | |
|---|---|---|---|
| KR | 100695499 B1 | 3/2007 | |
| KR | 101033174 B1 | 5/2011 | |

*Primary Examiner* — Thinh T Nguyen
(74) *Attorney, Agent, or Firm* — Harness, Dickey & Pierce, P.L.C.

(57) ABSTRACT

A method of fabricating a semiconductor device includes forming a gate pattern on a substrate, and etching sides of the gate pattern using a first wet-etching process to form a first recess. The first wet-etching process includes using an etchant containing a first chemical substance including a hydroxyl functional group (—OH) and a second chemical substance capable of oxidizing the substrate. The concentration of the second chemical substance is 1.5 times or less the concentration of the first chemical substance.

12 Claims, 7 Drawing Sheets

(56) References Cited

U.S. PATENT DOCUMENTS

| | | |
|---|---|---|
| 7,964,910 B2 | 6/2011 | Dyer |
| 8,071,481 B2 | 12/2011 | Kao et al. |
| 8,114,727 B2 | 2/2012 | Xiong et al. |
| 2006/0157797 A1* | 7/2006 | Tateshita .................. 257/369 |
| 2010/0219474 A1 | 9/2010 | Kronholz et al. |
| 2011/0049567 A1 | 3/2011 | Peng et al. |
| 2011/0183481 A1 | 7/2011 | Dyer |
| 2011/0237039 A1 | 9/2011 | Yang et al. |

* cited by examiner

METHOD OF FABRICATING SEMICONDUCTOR DEVICE

CROSS REFERENCE TO RELATED APPLICATION

This application claims priority from Korean Patent Application No. 10-2012-0103418 filed on Sep. 18, 2012 in the Korean Intellectual Property Office, the disclosure of which is incorporated herein by reference in its entirety.

BACKGROUND

1. Field

Some example embodiments relate to a method of fabricating a semiconductor device.

2. Description of the Related Art

With the development of electronic technology, semiconductor devices are being downscaled rapidly. In particular, semiconductor devices are being required to operate not only fast but also accurately. Therefore, research is being conducted to optimize or improve the structure of a transistor included in a semiconductor device.

SUMMARY

Some example embodiments provide a method of fabricating a semiconductor device, the method being employed to avoid a loading effect and simplify the entire fabrication process by forming recesses on both sides of a gate pattern using wet etching before forming an embedded source/drain as part of a strained silicon process.

However, example embodiments are not restricted as set forth herein. The above and other example embodiments will become more apparent to one of ordinary skill in the art to which the inventive concepts pertain by referencing the detailed description given below.

According to an example embodiment, a method of fabricating a semiconductor device includes forming a gate pattern on a substrate, and etching sides of the gate pattern using a first wet-etching process to form a first recess. The first wet-etching process includes using an etchant containing a first chemical substance including a hydroxyl functional group (—OH) and a second chemical substance capable of oxidizing the substrate. The concentration of the second chemical substance is 1.5 times or less the concentration of the first chemical substance.

According to another example embodiment, a method of fabricating a semiconductor device includes forming a plurality of first gate patterns on a first region of a substrate, the plurality of first gate patterns having a first width therebetween, forming a plurality of second gate patterns on a second region of the substrate, the plurality of second gate patterns having a second width therebetween different from the first width, and etching sides of the plurality of first and second gate patterns simultaneously using a first wet-etching process. The sides of the plurality of first gate patterns are etched to form a first recess and the sides of the plurality of second gate patterns are etched to form a second recess. The first recess has a first distance between an edge of the first recess and a first boundary surface between the first spacer and the first gate insulating layer, and the second recess has a second distance between an edge of the second recess and a second boundary surface between the second spacer and the second gate insulating layer. The first distance is equal to the second distance.

According to another example embodiment, a method of fabricating a semiconductor device includes forming gate patterns on a substrate, the gate patterns including a spacer and a gate insulating layer, etching sides of the gate patterns using a first wet-etching process to form a first recess, the first recess having a first distance between an edge of the first recess and a boundary surface between the spacer and the gate insulating layer, and etching the first recess using a second wet-etching process to form a second recess, the second recess having a second distance between the edge of the second recess and the boundary surface between the spacer and the gate insulating layer, the second distance being smaller than the first distance.

BRIEF DESCRIPTION OF THE DRAWINGS

The above and other aspects and features of the inventive concepts will become more apparent by describing in detail example embodiments thereof with reference to the attached drawings, in which.

DETAILED DESCRIPTION OF THE EMBODIMENTS

Figure 1:
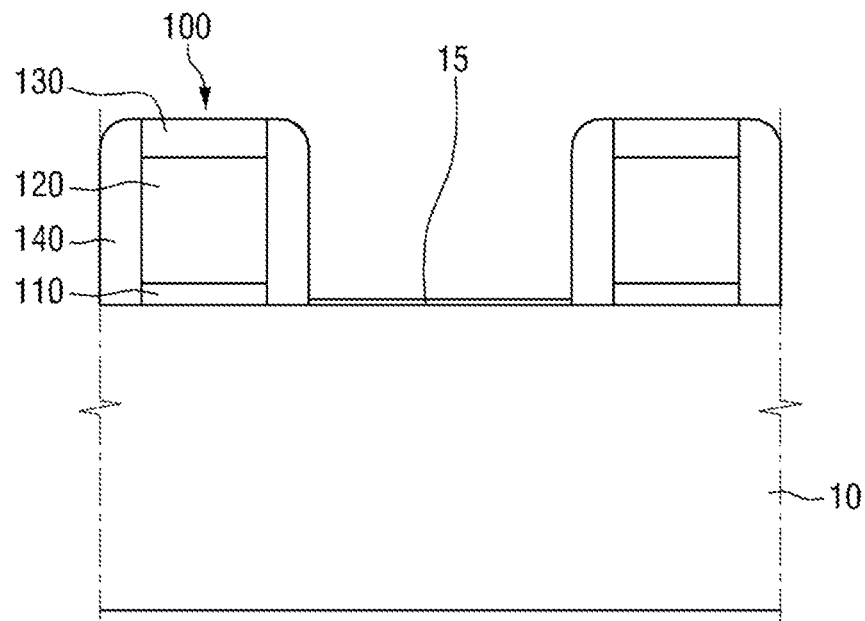
FIGS. 1 through 5 are views illustrating intermediate processes included in a method of fabricating a semiconductor device according to an example embodiment.

The inventive concepts will now be described more fully hereinafter with reference to the accompanying drawings, in which example embodiments are shown. The inventive concepts may, however, be embodied in different forms and should not be construed as limited to the embodiments set forth herein. Rather, these embodiments are provided so that this disclosure will be thorough and complete, and will fully convey the scope of the inventive concepts to those skilled in the art. The same reference numbers indicate the same components throughout the specification. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the inventive concepts.

The use of the terms "a" and "an" and "the" and similar referents in the context of describing the inventive concepts (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which the inventive concepts belong. It is noted that the use of any and all examples, or exemplary terms provided herein is intended merely to better illuminate the inventive concepts and is not a limitation on the scope of the inventive concepts unless otherwise specified. Further, unless defined otherwise, all terms defined in generally used dictionaries may not be overly interpreted.

A method of fabricating a semiconductor device according to an example embodiment will now be described with reference to FIGS. 1 through 5. FIGS. 1 through 5 are views illustrating intermediate processes included in a method of fabricating a semiconductor device according to an example embodiment.

Referring to FIG. 1, a plurality of first gate patterns 100 may be formed on a substrate 10. Each of the first gate patterns 100 may include a first gate insulating layer 110, a first gate electrode 120, and a first spacer 140. Each of the first gate patterns 100 may further include a first gate hard mask 130. Each of the first gate patterns 100 may be formed by sequentially stacking the first gate insulating layer 110 and the first gate electrode 120. The first spacer 140 may be formed on sidewalls of each of the first gate patterns 100. If the first gate hard mask 110 is formed, the first spacer 140 may be formed to contact the first gate insulating layer 110, the first gate electrode 120, and the first gate hard mask 130.

In the method of fabricating a semiconductor device according to the current embodiment, the first gate patterns 110 may be, for example, dummy gate patterns. Thus, a gate insulating layer and/or an electrode of a gate may be formed again in a subsequent process. However, example embodiments are not limited thereto.

An insulating layer, an electrode layer, and a hard mask layer may be formed sequentially on the substrate 10. Then, mask patterns (not shown) for forming the first gate patterns 100 may be formed on the hard mask layer. The insulating layer, the electrode layer and the hard mask layer formed on the substrate 10 may be etched using the mask patterns as a mask, thereby forming a first gate stack structure (110, 120 and 130) on the substrate 10. Then, a spacer layer may be formed on the substrate 10 to cover the first gate stack structure (110, 120 and 130). By etching the spacer layer, the first spacer 140 may be formed on sidewalls of the first gate stack structure (110, 120 and 130). As a result, the first gate patterns 100 may be formed on the substrate 10.

Specifically, the substrate 10 may be a bulk silicon substrate or a silicon-on-insulator (SOI) substrate. Otherwise, the substrate 10 may be a silicon substrate or a substrate made of another material such as silicon germanium, indium antimonide, lead telluride, indium arsenide, indium phosphide, gallium arsenide, or gallium antimonide. However, the material that forms the substrate 10 is not limited to the above example materials. In the following description of the method of fabricating a semiconductor device according to an example embodiment, the substrate 10 is a silicon substrate.

The first gate insulating layer 110 may be a silicon oxide layer, SiON, $GexOyNz$, $GexSiyOz$, a high-k dielectric layer, a combination of these materials, or a sequential stack of these materials. The high-k dielectric layer may include, but not limited to, one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. The first gate insulating layer 110 may be formed by heat treatment, chemical substance treatment, atomic layer deposition (ALD), or chemical vapor deposition (CVD). If the first gate insulating layer 110 contains a high-k dielectric substance, a first barrier layer (not shown) may further be formed between the first gate insulating layer 110 and the first gate electrode 120. The barrier layer may contain at least one of titanium nitride (TiN), tantalum nitride (TaN), and a combination of the same.

The first gate electrode 120 may be, for example, silicon. Specifically, the first gate electrode 120 may contain, but not limited to, one of polycrystalline silicon (poly-Si), amorphous silicon (a-Si), titanium (Ti), titanium nitride (TiN), tantalum nitride (TaN), aluminum (Al), and a combination of the same. The polycrystalline silicon may be formed by CVD, and the amorphous silicon may be formed by sputtering, CVD, or plasma enhanced chemical vapor deposition (PECVD). However, example embodiments are not limited thereto.

The first gate hard mask 130 may include, e.g., a nitride layer, an oxide layer, and a combination of the same. The first gate hard mask 130 may be formed by, e.g., CVD.

The first spacer 140 may include, e.g., a silicon nitride layer, a silicon oxynitride layer, a silicon oxide layer, or a silicon carbon nitride (SiOCN) layer. The first spacer 140 may be formed by, e.g., CVD. In the drawing, the first spacer 140 is a single layer. However, example embodiments are not limited thereto, and the first spacer 140 can be formed as a multilayer.

Referring to FIG. 1, after the first gate patterns 100 are formed, a natural oxide layer 15 may be formed on an exposed portion of the substrate 10 between the first gate patterns 100.

Figure 2:
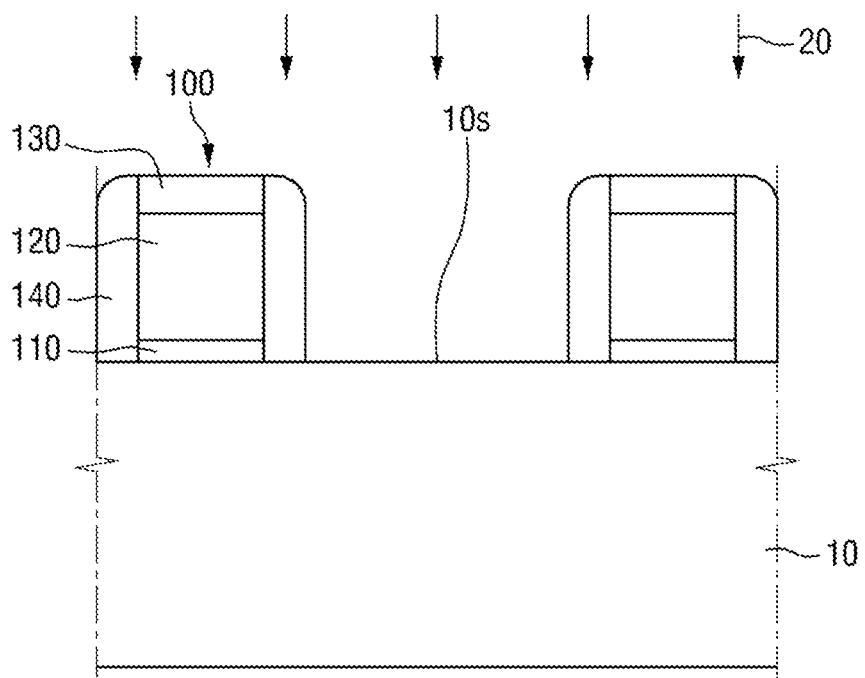

Referring to FIG. 2, the natural oxide layer 15 on the substrate 10 may be removed by a cleansing process 20. The removal of the natural oxide layer 15 may expose a top surface 10s of the substrate 10 between the first gate patterns 100. The cleansing process 20 may be a chemical solution or a dry-etching process. The chemical solution may be hydrofluoric acid (HF) or buffered oxide etchant. The dry-etching process may use chemical oxide removal (COR), SiCoNi, PNC, or NOR.

Figure 3A:
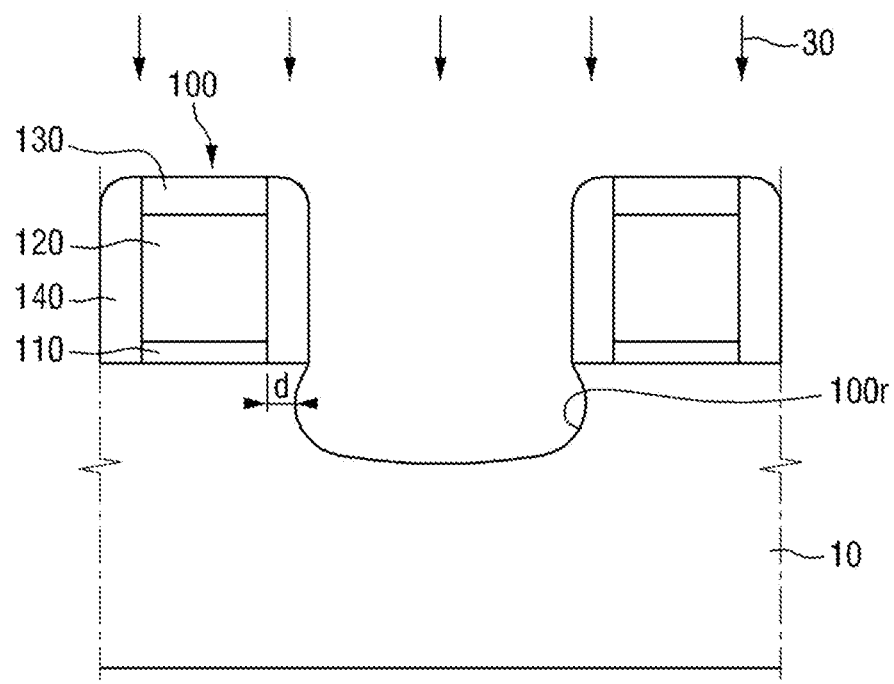
Figure 3B:
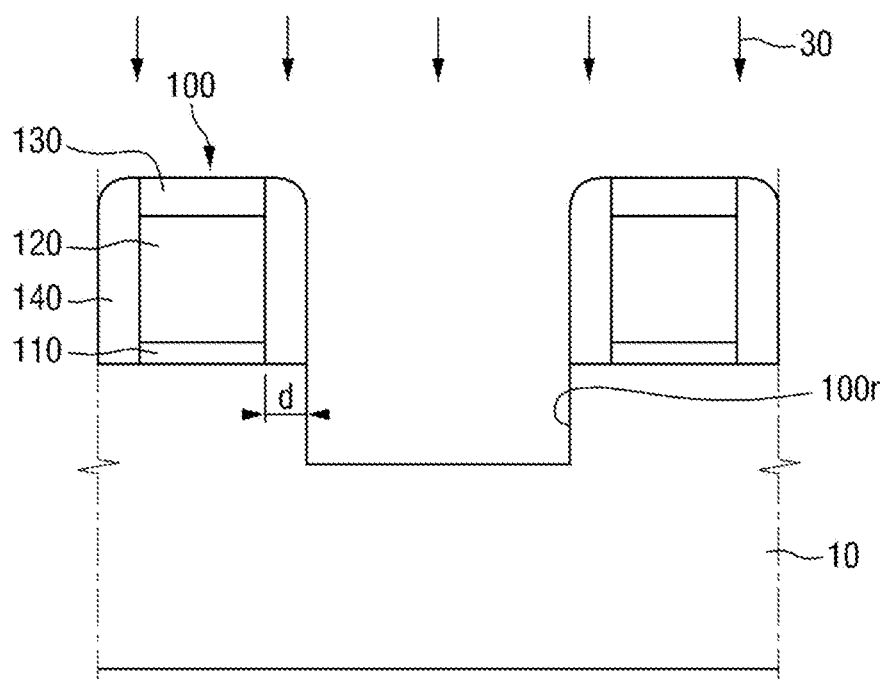

Referring to FIGS. 3A and 3B, a first recess 100r may be formed on sides of the first gate patterns 100 by a first wet-etching process 30. The first recess 100r formed between the first gate patterns 100 is formed in the exposed portion of the substrate 10 between the first spacers 140 of the first gate patterns 100. A first etchant used in the first wet-etching process 30 may contain a first chemical substance which contains, e.g., a hydroxyl functional group (—OH) and a second chemical substance which can oxidize the substrate 10. Specifically, the first etchant may contain at least one of ammonium hydroxide ($NH_4OH$), potassium hydroxide (KOH) and tetramethyl ammonium hydroxide (TMAH) as the first chemical substance and contain, e.g., hydrogen peroxide ($H_2O_2$) as the second chemical substance. In the description of the method of fabricating a semiconductor device according to an example embodiment, the first etchant contains $NH_4OH$ and $H_2O_2$.

The $H_2O_2$ concentration in the first etchant may be 1.5 times or less the $NH_4OH$ concentration. In other words, a ratio of the $NH_4OH$ concentration to the $H_2O_2$ concentration in the first etchant may be 2:3, or the $NH_4OH$ concentration may be increased. Specifically, the $H_2O_2$ concentration in the first etchant may be 0.3 to 15%, and the $NH_4OH$ concentration in the first etchant may be 0.2 to 20%. Thus, the $H_2O_2$ concentration in the first etchant is 0.015 to 1.5 times the $NH_4OH$ concentration. The ratio of the $NH_4OH$ concentration to the $H_2O_2$ concentration in the first etchant may be a ratio that has a higher etch selectivity with respect to the substrate 10 than with respect to the first gate patterns 100. That is, the first etchant has a higher etch selectivity with respect to a silicon substrate than with respect to a silicon oxide layer and/or a silicon nitride layer. The first etchant used in the first wet-etching process 30 may be, but is not limited to, at a temperature of 25 to 95° C.

Referring to FIG. 3A, the first recess 100r formed on the sides of the first gate patterns 100 may have a first proximity distance "d". In addition, side surfaces of the first recess 100r may be ball-shaped curved surfaces. Here, "proximity distance" refers to a shortest distance between a recess and an extension line of a boundary surface between a spacer and a gate insulating layer, the extension line extending downward from the top surface 10s of the substrate 10. That is, the first proximity distance "d" is the shortest distance between an extension line of a boundary surface between the first spacer 140 and the first gate insulating layer 110 and the first recess 100r.

The first proximity distance d can be varied by adjusting the ratio of the $NH_4OH$ concentration to the $H_2O_2$ concentration in the first etchant Specifically, $NH_4OH$ may etch the silicon substrate 10, thereby increasing a width and depth of the first recess 100r. On the other hand, $H_2O_2$ may oxidize an exposed portion of the silicon substrate 10, thereby preventing and/or reducing an increase in the width and depth of the first recess 100r. Therefore, an increase in the $H_2O_2$ concentration in the first etchant may lead to an increase in the first proximity distance d. Accordingly, a length by which the first recess 100r is overlapped by each of the first gate patterns 100 may be reduced. However, an increase in the $NH_4OH$ concentration in the first etchant may lead to a reduction in the first proximity distance d. Accordingly, the length by which the first recess 100r is overlapped by each of the first gate patterns 100 may increase. If the $NH_4OH$ concentration in the first etchant is increased, the first recess 100r may be overlapped even by the first gate insulating layer 110.

Referring to FIG. 3B, the first proximity distance d of the first recess 100r may be substantially equal to a length of a boundary surface between the first spacer 140 and the substrate 10. In addition, the side surfaces of the first recess 100r may be orthogonal to the top surface 10s of the substrate 10. That is, the first recess 100r may have a box-shaped cross section.

The box-shaped first recess 100r may be formed by further adding an additive to the first etchant used in the first wet-etching process 30. The additive added to the first etchant may be a surfactant or an inhibitor. The surfactant, if added in the first wet-etching process 30, may facilitate the etching of a bottom surface of the first recess 100r. Accordingly, the bottom surface of the first recess 100r may be etched faster than the side surfaces of the first recess 100r, resulting in the box-shaped first recess 100r. Conversely, the inhibitor, if added in the first wet-etching process 30, may inhibit the etching of the side surfaces of the first recess 100r. Accordingly, the side surfaces of the first recess 100r may be etched slower than the bottom surface of the first recess 100r, resulting in the box-shaped first recess 100r.

In the description of the method of fabricating a semiconductor device according to the example embodiment, the first recess 100r is shaped as shown in FIG. 3A.

Figure 4:
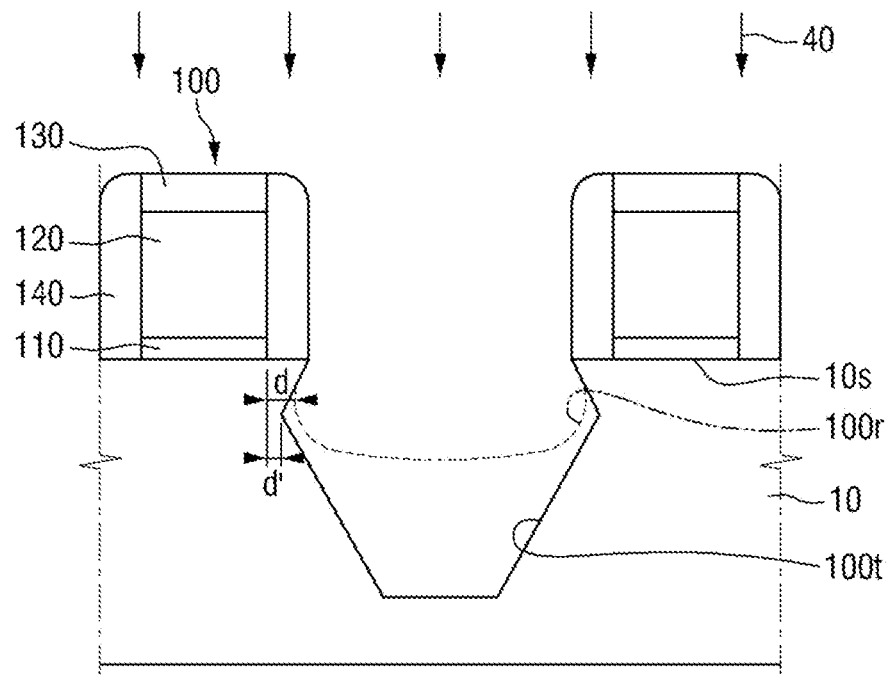

Referring to FIG. 4, a second recess 100t may be formed on the sides of the first gate patterns 100 by a second wet-etching process 40. In other words, the first recess 100r may be etched by the second wet-etching process 40, thereby forming the second recess loot on the sides of the first gate patterns 100. The second recess 100t may have a second proximity distance d'. In addition, the second recess 100t may have a sigma-shaped cross section. However, example embodiments are not limited thereto. That is, if the cross section of the first recess 100r is box-shaped, the cross section of the second recess 100t formed by the second wet-etching process 40 may be box-shaped.

A second etchant used in the second wet-etching process 40 may contain a chemical substance that can etch the substrate 10 but may not contain a chemical substance that inhibits the etching of the substrate 10. Specifically, the second etchant may contain $NH_4OH$ which can etch a silicon substrate along a crystal face but may not contain $H_2O_2$ which inhibits the etching of the silicon substrate by oxidizing the silicon substrate.

Referring to FIG. 4, the second proximity distance d' of the second recess 100t may be smaller than the first proximity distance d of the first recess 100r. Since the exposed side surfaces and bottom surface of the first recess 100r are etched by the second wet-etching process 40, the space inside the second recess 100t may be larger than the space inside the first recess 100r. In addition, of the ball-shaped, curved side surfaces of the first recess 100r, a crystal face which is etched slowest by the second etchant appears in the second recess 100t. Thus, the second proximity distance d' of the second recess 100t may become smaller than the first proximity distance d of the first recess 100r by the second wet-etching process 40.

Figure 5:
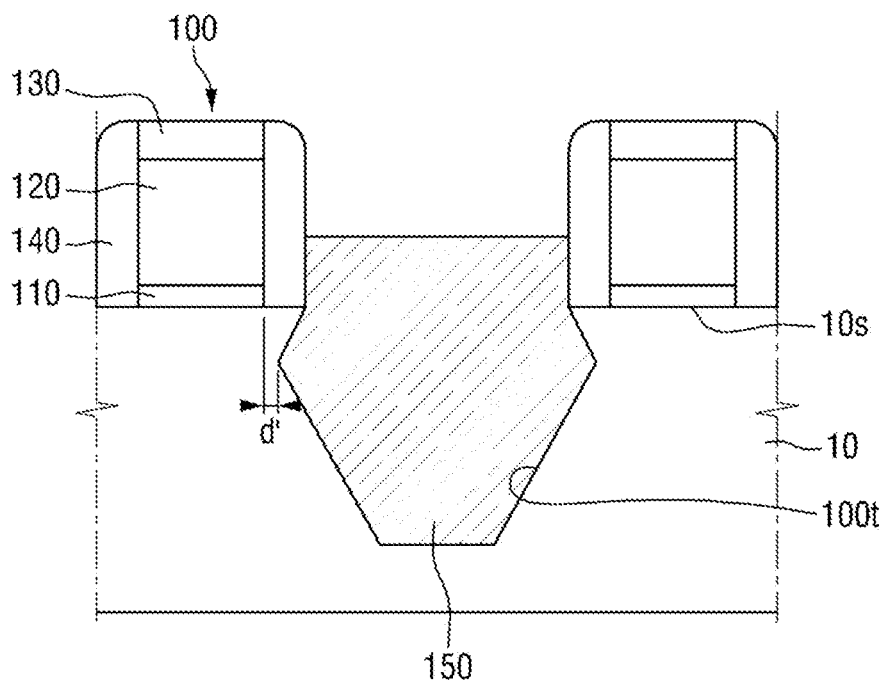

Referring to FIG. 5, a first semiconductor pattern 150 may be formed in the second recess 100t. The first semiconductor pattern 150 may be elevated above the top surface 10s of the substrate 10. However, example embodiments are not limited thereto. The first semiconductor pattern 150 may apply tensile or compressive stress to a channel region of each of the first gate patterns 100, thereby improving the performance of a semiconductor device. The first semiconductor pattern 150 may be each of a source and a drain of a transistor. The first semiconductor pattern 150 may be formed by epitaxially growing a semiconductor material in the second recess 100t. That is, the first semiconductor pattern 150 may be a monocrystalline epitaxial layer. The first semiconductor pattern 150 may be formed by CVD or ALD. If the first semiconductor pattern 150 is designed to apply tensile or compressive stress to the channel region, it may be, but is not limited to, a material having a different lattice constant from the substrate 10.

If a semiconductor device is a p-type MOS (PMOS) transistor, it is operated by holes. Therefore, it may be desirable to apply compressive stress to the substrate 10. To this end, the first semiconductor pattern 150 may be made of a material having a larger lattice constant than the substrate 10. That is, if the substrate 10 is a silicon substrate, the first semiconductor pattern 150 may be made of silicon germanium (SiGe) having a greater lattice constant than silicon. In addition, the second recess 100t in which the first semiconductor pattern 150 is formed may have, but not limited to, a sigma-shaped cross section as shown in FIG. 5.

If the semiconductor device is an n-type MOS (NMOS) transistor, it is operated by electrons. Therefore, it may be desirable to apply tensile stress to the substrate 10. To this end, the first semiconductor pattern 150 may be made of a material having a smaller lattice constant than the substrate 10. That is, if the substrate 10 is a silicon substrate, the first semiconductor pattern 150 may be made of silicon carbide (SiC) having a smaller lattice constant than silicon. However, if the semiconductor device is the NMOS transistor, the first semiconductor pattern 150 in the second recess 100t may form an elevated silicon epitaxial layer. In addition, the second recess 100t in which the first semiconductor pattern 150 is formed may have a sigma-shaped cross section. However, example embodiments are not limited thereto, and the second recess 100t can have a box-shaped cross section as shown in FIG. 3B.

A method of fabricating a semiconductor device according to another example embodiment will now be described with reference to FIGS. 6 through 9.

FIGS. 6 through 9 are diagrams illustrating intermediate processes included in a method of fabricating a semiconductor device according to another example embodiment.

Figure 6:
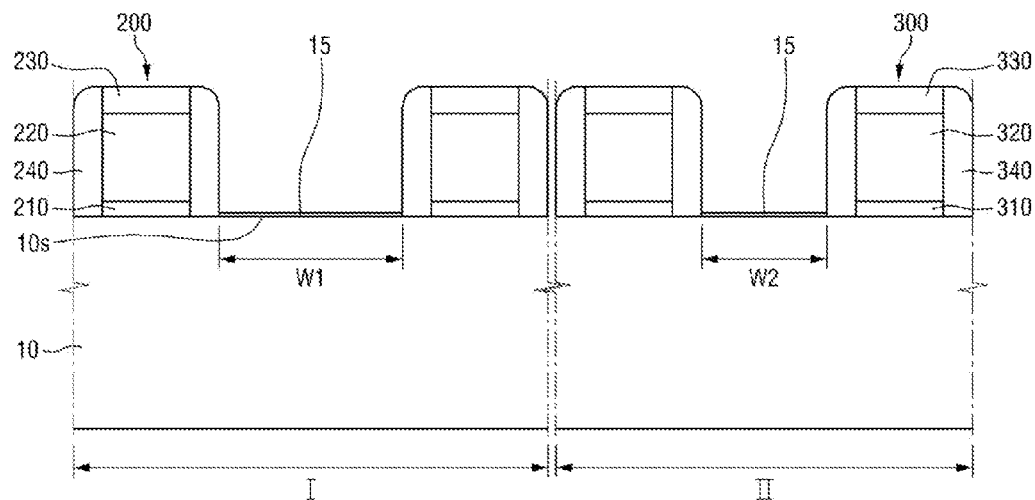
FIGS. 6 through 9 are diagrams illustrating intermediate processes included in a method of fabricating a semiconductor device according to another example embodiment.

Referring to FIG. 6, a plurality of second gate patterns 200 may be formed on a first region I of a substrate 10, and a plurality of third gate patterns 300 may be formed on a second region II of the substrate 10. A distance between the second gate patterns 200 may be a first width w1, and a distance between the third gate patterns 300 may be a second width w2. The first width w1 and the second width w2 have different values. Here, "width" refers to a distance between adjacent spacers of neighboring gate patterns, more specifically, a width of an exposed portion of a top surface 10s of the substrate 10 between neighboring gate patterns.

Each of the second gate patterns 200 may include a second gate insulating layer 210, a second gate electrode 220, and a second spacer 240. Each of the second gate patterns 200 may further include a second gate hard mask 230. Each of the second gate patterns 200 may be formed by sequentially stacking the second gate insulating layer 210, the second gate electrode 220, and the second gate hard mask 230. The second spacer 240 may be formed on sidewalls of each of the second gate patterns 200. Each of the third gate patterns 300 may include a third gate insulating layer 310, a third gate electrode 320, and a third spacer 340. Each of the third gate patterns 300 may further include a third gate hard mask 330. Each of the third gate patterns 300 may be formed by sequentially stacking the third gate insulating layer 310, the third gate electrode 320 and the third gate hard mask 330. The third spacer 340 may be formed on sidewalls of each of the third gate patterns 300.

The first width w1 is a distance between adjacent second spacers 240 of neighboring second gate patterns 200, and the second width w2 is a distance between adjacent third spacers 340 of neighboring third gate patterns 300.

In the method of fabricating a semiconductor device according to the example embodiment, the second gate patterns 200 and/or the third gate patterns 300 may be, for example, dummy gate patterns. Thus, a gate insulating layer and/or an electrode of a gate may be formed again in a subsequent process. However, example embodiments are not limited thereto.

A method of forming the second gate patterns 200 and the third gate patterns 300 and a material contained in each component of the second and third gate patterns 200 and 300 are identical to the method of forming the first gate patterns 100 and the material contained in each component of the first gate patterns 100, and thus a repetitive description thereof will be omitted. In addition, in the description of the current example embodiment, the substrate 10 is a silicon substrate.

Referring to FIG. 6, after the second gate patterns 200 and the third gate patterns 300 are formed, a natural oxide layer 15 may be formed on an exposed portion of the substrate 10 between the second gate patterns 200 and on an exposed portion of the substrate 10 between the third gate patterns 300.

Figure 7:
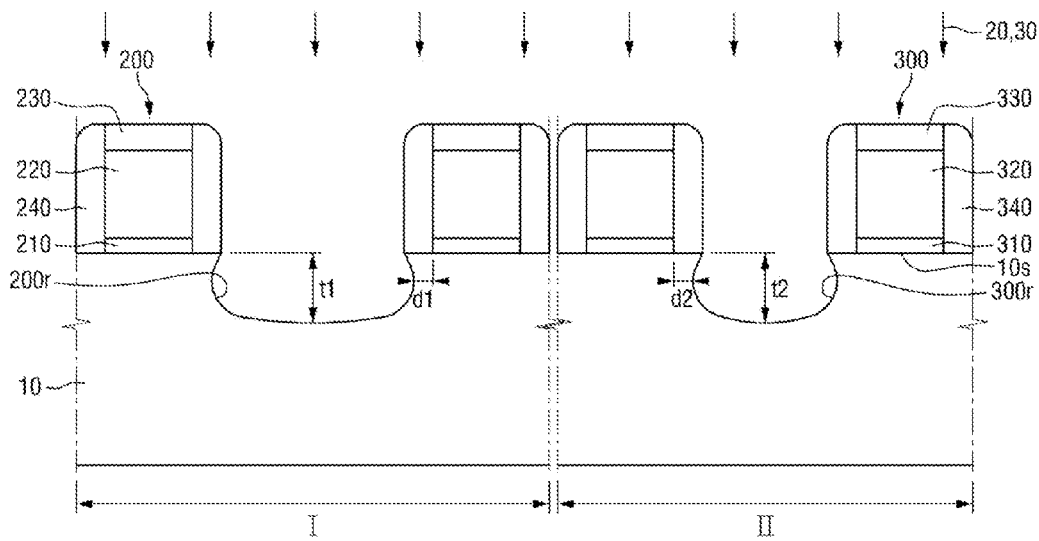

Referring to FIG. 7, the natural oxide layer 15 formed between the second gate patterns 200 and the natural oxide layer 15 formed between the third gate patterns 300 may be removed by a cleansing process 20. The removal of the natural oxide layer 15 exposes the top surface 10s of the substrate 10.

Referring to FIG. 7, a third recess 200r may be formed by etching the exposed portion of the substrate 10 between the second gate patterns 200 in a first wet-etching process 30, and a fourth recess 300r may be formed by etching the exposed portion of the substrate 10 between the third gate patterns 300 in the first wet-etching process 30. By the first wet-etching process 30, the third recess 200r and the fourth recess 300r may be simultaneously formed in the first region I and the second region II, respectively.

The third recess 200r may have a third proximity distance d1 and a first depth t1. The fourth recess 300r may have a fourth proximity distance d2 and a second depth t2. The third recess 200r and the fourth recess 300r formed simultaneously have equal proximity distances and equal depths. That is, the third proximity distance d1 is equal to the fourth proximity distance d2, and the first depth t1 is equal to the second depth t2. Here, "depth" refers to a distance from the top surface 10s of the substrate 10 to a bottom surface of a recess. In addition, "equal proximity distances" and "equal depths" means not only that two compared recesses have perfectly equal proximity distances and depths but also that there may exist a fine difference in proximity distance and depth resulting from processing margins.

Referring to FIG. 7, a first etchant may be used in the first wet-etching process 30 performed to form the third recess 200r and the fourth recess 300r. In the current example embodiment, the first etchant contains a first chemical substance which contains, e.g., a hydroxyl functional group (—OH) and a second chemical substance which can oxidize the substrate 10. Specifically, the first etchant may contain at least one of ammonium hydroxide ($NH_4OH$), potassium hydroxide (KOH) and tetramethyl ammonium hydroxide (TMAH) as the first chemical substance and contain, e.g., hydrogen peroxide ($H_2O_2$) as the second chemical substance. In the description of the method of fabricating a semiconductor device according to another example embodiment, the first etchant contains $NH_4OH$ and $H_2O$.

$NH_4OH$ increases the size of a recess by etching the substrate 10, whereas $H_2O_2$ inhibits the expansion of the recess by oxidizing the substrate 10. The $H_2O_2$ concentration in the first etchant may be 1.5 times or less the $NH_4OH$ concentration. In other words, a ratio of the $NH_4OH$ concentration to the $H_2O_2$ concentration in the first etchant may be 2:3, or the $NH_4OH$ concentration may be increased. Specifically, the $H_2O_2$ concentration in the first etchant may be 0.3 to 15%, and the $NH_4OH$ concentration in the first etchant may be 0.2 to 20%. Thus, the $H_2O_2$ concentration in the first etchant is 0.015 to 1.5 times the $NH_4OH$ concentration. In the method of fabricating a semiconductor device according to the current example embodiment, the first etchant has a higher etch selectivity with respect to a silicon substrate than with respect to a silicon oxide layer and/or a silicon nitride layer.

As described above with reference to FIG. 3A, the third proximity distance d1 and the first depth t1 can be varied by adjusting the ratio of the $NH_4OH$ concentration to the $H_2O_2$ concentration in the first etchant. An increase in the $H_2O_2$ concentration in the first etchant may lead to an increase in the third proximity distance d1. On the other hand, an increase in the $NH_4OH$ concentration in the first etchant may lead to a reduction in the third proximity distance d1. If the first depth t1 is varied by adjusting the ratio of the $NH_4OH$ concentration to the $H_2O_2$ concentration in the first etchant, a depth from the top surface 10s of the substrate 10, at which a proximity distance is measured in a subsequent second wet-etching process, can be adjusted.

If wet etching is used to form initial recesses in regions having different distances between gate patterns, the following effects can be obtained. Dry etching can be used to simultaneously form a recess between the second gate patterns 200 having the first width w1 therebetween and a recess between the third gate patterns 300 having the second width w2 therebetween. In this case, however, since the distance between the second gate patterns 200 and the distance between the third gate patterns 300 are different, a loading effect may be generated. In other words, the concentration of an etching gas introduced between the second gate patterns 200 having the first width w1 therebetween is different from the concentration of the etching gas introduced between the third gate patterns 300 having the second width w2 therebetween. Such a difference in the etching gas concentration results from a difference in the distance between neighboring gate patterns. The different concentrations of the etching gas used to form the recesses in the first region I and the second region II may cause the recesses formed in the first region I and the second region II to have different proximity distances and depths. If the recesses having different proximity distances and depths are wet-etched, recesses formed as a result of the wet-etching process may also have different proximity distances and depths. In addition, if a semiconductor pattern is epitaxially grown in each of the recesses having different proximity distances and depths, the reliability of a semiconductor device may be undermined, and the controllability of the fabrication process may be reduced.

To solve the above problems that arise when dry etching is used, an element that reduces the etching speed of silicon can be implanted into a region in which a recess having a small proximity distance and a large depth is formed. The element that reduces the etching speed of silicon may include one of carbon (C), boron (B), silicon (Si), germanium (Ge), and a combination of the same. The implantation of the element makes it possible to form recesses having equal proximity distances and equal depths in different regions, respectively.

However, if wet etching is performed using an etchant with an adjusted ratio of the $NH_4OH$ concentration to the $H_2O_2$ concentration, recesses having equal proximity distances and equal depths can be respectively formed in different regions without the need for an additional process such as an ion implantation process. In addition, by using the etchant with the adjusted ratio of the $NH_4OH$ concentration to the $H_2O_2$ concentration, shapes (i.e., proximity distances and depths) of initial recesses formed in the substrate can be changed. Further, by changing the shapes of the initial recesses, it is possible to adjust proximity distances of final recesses formed as a result of a subsequent wet-etching process and adjust a depth from the top surface of the substrate at which the proximity distances are measured.

Figure 8:
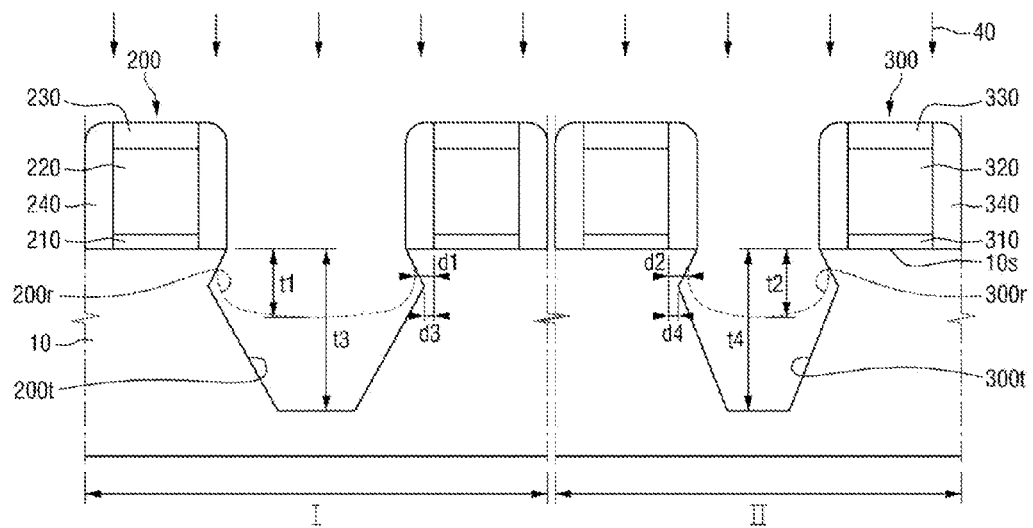

Referring to FIG. 8, a second wet-etching process 40 may be performed to form a fifth recess 200t between the second gate patterns 200 and a sixth recess 300t between the third gate patterns 300. The fifth recess 200t and the sixth recess 300t may be formed simultaneously by the second wet-etching process 40. In other words, as the third recess 200r and the fourth recess 300r are etched by the second wet-etching process 40, the fifth recess 200t and the sixth recess 300t may respectively be formed between the second gate patterns 200 and between the third gate patterns 300.

The fifth recess 200t may have a fifth proximity distance d3 and a third depth t3, and the sixth recess 300t may have a sixth proximity distance d4 and a fourth depth t4. The fifth proximity distance d3 may be equal to the sixth proximity distance d4, and the third depth t3 may be equal to the fourth depth t4. While the fifth recess 200t and the sixth recess 300t may have equal proximity distances and equal depths, the space inside the fifth recess 200t and the space inside the sixth recess 300t may have different widths. That is, when the first width w1 between the second gate patterns 200 is greater than the second width w2 between the third gate patterns 300, the space inside the fifth recess 200t may be wider than the space inside the sixth recess 300t.

The third proximity distance d1 of the third recess 200r may be greater than the fifth proximity distance d3 of the fifth recess 200t. In other words, the space inside the third recess 200r may be expanded by the second wet-etching process 40. Therefore, a reference point from which the fifth proximity distance d3 is measured may be closer to an extension line of a boundary surface between the second spacer 240 and the second gate insulating layer 210 than a reference point from which the third proximity distance d1 is measured. However, the reference point of the fifth proximity distance d3 can also be located on the substrate 10 directly under the second gate insulating layer 210. That is, the reference point of the third proximity distance d1 may be located on a right side of the extension line of the boundary surface between the second spacer 240 and the second gate insulating layer 210, and the reference point of the fifth proximity distance d3 may be located on a left side of the extension line. In this case, the third proximity distance d1 of the third recess 200r may be smaller than the fifth proximity distance d3 of the fifth recess 200t.

The fifth recess 200t and the sixth recess 300t may have, but not be limited to, sigma-shaped cross sections. If recesses formed by the first wet-etching process 30 have box-shaped cross sections, the fifth recess 300r and the sixth recess 300t may have box-shaped cross sections.

Figure 9:
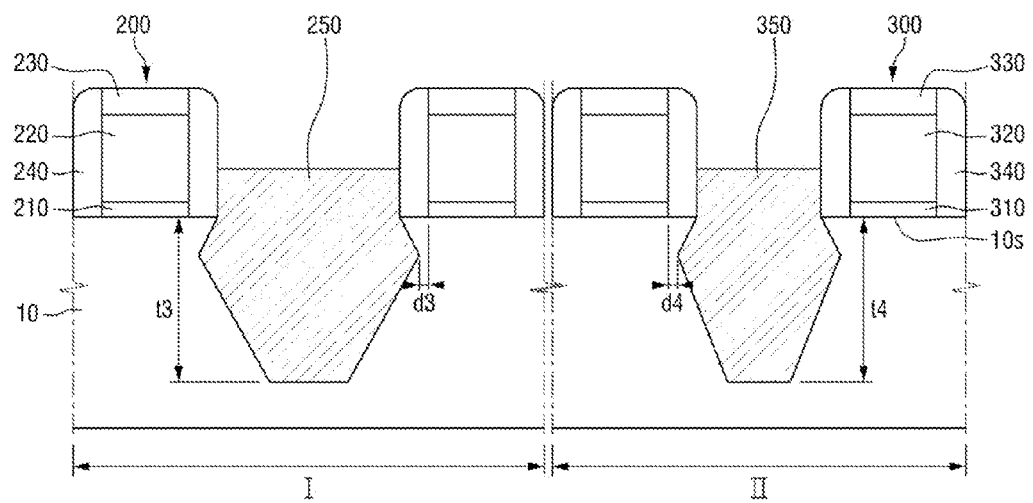

Referring to FIG. 9, a second semiconductor pattern 250 and a third semiconductor pattern 350 may be formed in the fifth recess 200t and the sixth recess 300t, respectively. The second semiconductor pattern 250 and/or the third semiconductor pattern 350 may be elevated above the top surface 10s of the substrate 10. However, example embodiments are not limited thereto. The second semiconductor pattern 250 and the third semiconductor pattern 350 may be formed by epitaxially growing a semiconductor material in the fifth recess 200t and the sixth recess 300t, respectively.

If a semiconductor device is a PMOS transistor, the second semiconductor pattern 250 may be made of silicon germanium (SiGe) having a larger lattice constant than the silicon substrate 10 in order to apply compressive stress to the substrate 10. However, if the semiconductor device is an NMOS transistor, the second semiconductor pattern 250 may be made of silicon carbide (SiC) or silicon having a lattice constant equal to or smaller than that of the silicon substrate in order to apply tensile stress to the substrate 10.

Figure 10:
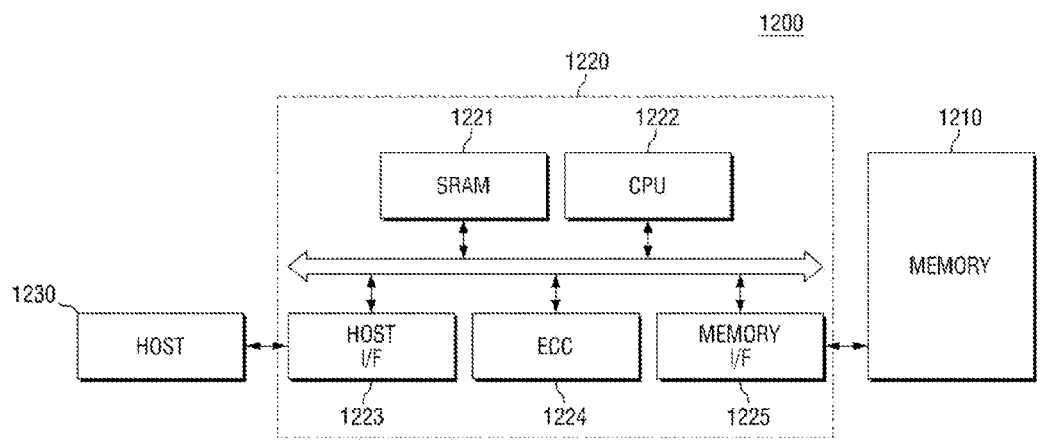
FIG. 10 is a block diagram of a memory card including a semiconductor device fabricated according to some example embodiments.

FIG. 10 is a block diagram of a memory card 1200 including a semiconductor device fabricated according to some example embodiments.

Referring to FIG. 10, a memory 1210 including a semiconductor device fabricated according to various example embodiments may be employed in the memory card 1200. The memory card 1200 may include a memory controller 1220 which controls data exchange between a host 1230 and the memory 1210. A static random access memory (SRAM) 1221 may be used as an operation memory of a central processing unit (CPU) 1222. A host interface 1223 may include protocols used by the host 1230 to access the memory card 1200 and exchange data with the memory card 1200. An error correcting code (ECC) 1224 may detect and correct errors in data read from the memory 1210. A memory interface 1225 may interface with the memory 1210. The CPU 1222 may control the overall data exchange-related operation of the memory controller 1220.

Figure 11:
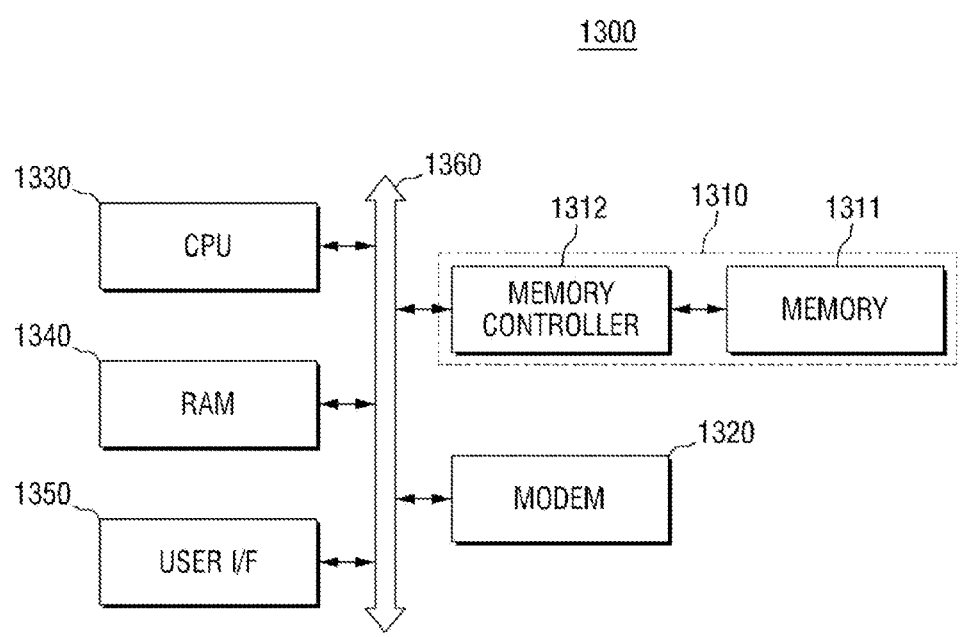
FIG. 11 is a block diagram of an information processing system using a semiconductor device fabricated according to some example embodiments.

FIG. 11 is a block diagram of an information processing system 1300 using a semiconductor device fabricated according to example embodiments. Referring to FIG. 11, the information processing system 1300 may include a memory system 1310 including a semiconductor device fabricated according to various example embodiments. The information processing system 1300 may include the memory system 1310, a modem 1320, a CPU 1330, a random access memory (RAM) 1340, and a user interface 1350 which are electrically connected to a system bus 1360. The memory system 1310 may include a memory 1311 and a memory controller 1312 and may be configured in substantially the same way as the memory card 1200 of FIG. 10.

Data processed by the CPU 1330 or data received from an external device may be stored in the memory system 1310. The information processing system 1300 can be applied to a memory card, a solid-state driver (SSD), a camera image sensor, and other various chipsets. For example, the memory system 1310 may be configured to employ an SSD. In this case, the information processing system 1300 can process large-volume data in a stable and reliable manner.

Figure 12:
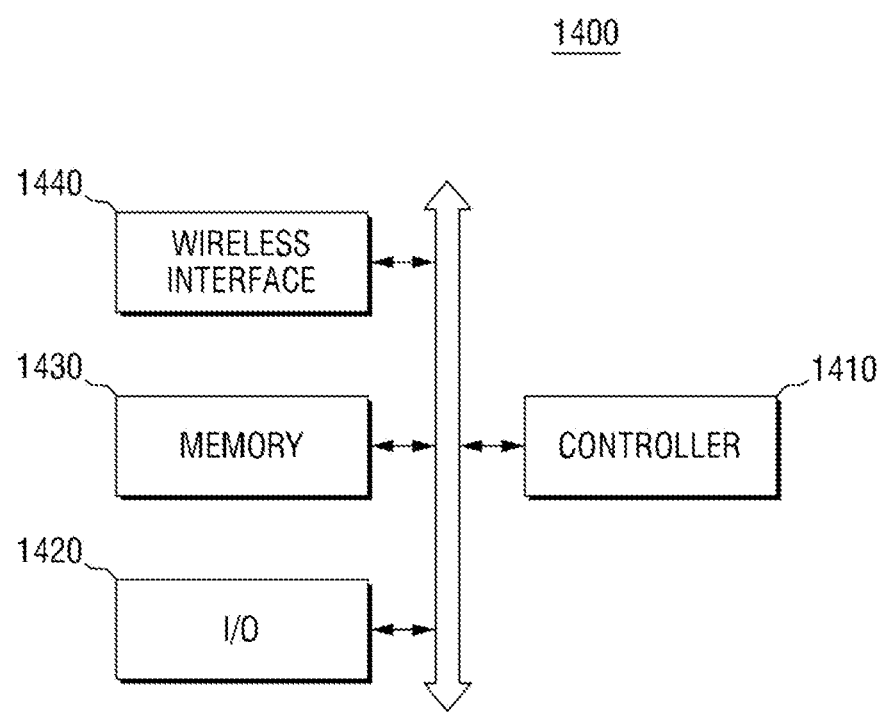
FIG. 12 is a block diagram of an electronic device including a semiconductor device fabricated according to some example embodiments.

FIG. 12 is a block diagram of an electronic device 1400 including a semiconductor device fabricated according to example embodiments. Referring to FIG. 12, the electronic device 1400 may include a semiconductor device fabricated according to various example embodiments. The electronic device 1400 can be used in wireless communication devices (such as a PDA, a notebook computer, a portable computer, a web tablet, a wireless phone, and/or a wireless digital music player) or various devices which exchange information in a wireless communication environment.

The electronic device 1400 may include a controller 1410, an input/output device 1420, a memory 1430, and a wireless interface 1440. The memory 1430 may include a semiconductor device fabricated according to various example embodiments. The controller 1410 may include a microprocessor, a digital signal processor, or the like. The memory 1430 may be used to store commands (or user data) processed by the controller 1410. The wireless interface 1440 may be used to exchange data over a wireless data network. The wireless interface 1440 may include an antenna and/or a wireless transceiver. The electronic device 1400 may use a third-generation communication system protocol such as Code Division Multiple Access (CDMA), Global System for Mobile communication (GSM), North 20 American Digital Cellular (NADC), Enhanced-Time Division Multiple Access (E-TDMA), Wideband CDMA (WCDMA), or CDMA-2000.

In concluding the detailed description, those skilled in the art will appreciate that many variations and modifications can be made to example embodiments without substantially departing from the principles of the inventive concepts. Therefore, the disclosed example embodiments are used in a generic and descriptive sense only and not for purposes of limitation.

What is claimed is:

1. A method of fabricating a semiconductor device, the method comprising:
    forming a plurality of first gate patterns on a first region of a substrate, the plurality of first gate patterns having a first width therebetween and including a first spacer and a first gate insulating layer;
    forming a plurality of second gate patterns on a second region of the substrate, the plurality of second gate patterns having a second width therebetween different from the first width and including a second spacer and a second gate insulating layer; and
    etching sides of the plurality of first and second gate patterns simultaneously using a first wet-etching process, the etching sides of the plurality of first gate patterns forming a first recess, and the etching sides of the plurality of second gate patterns forming a second recess, the first recess having a first distance between an edge of the first recess and a first boundary surface between the first spacer and the first gate insulating layer, and the second recess having a second distance between an edge of the second recess and a second boundary surface between the second spacer and the second gate insulating layer, the first distance being equal to the second distance.

2. The method of claim 1, wherein the etching forms the first recess and the second recess having a first depth and a second depth, respectively, from a top surface of the substrate, the first depth being equal to the second depth.

3. The method of claim 1, wherein the etching uses the first wet-etching process including a first etchant containing a first chemical substance including a hydroxyl functional group (—OH) and a second chemical substance capable of oxidizing the substrate.

4. The method of claim 3, wherein the etching uses the first wet-etching process including the first etchant containing ammonium hydroxide ($NH_4OH$) and hydrogen peroxide ($H_2O_2$).

5. The method of claim 4, wherein the concentration of the $H_2O_2$ is 1.5 times or less the concentration of the ammonium hydroxide.

6. The method of claim 1, further comprising:
    etching the first recess and the second recess simultaneously using a second wet-etching process, the etching the first recess forming a third recess between the first gate patterns, and the etching the second recess forming a fourth recess between the second gate patterns.

7. The method of claim 6, wherein the etching the first recess forms the third recess having a sigma shaped cross-section and the etching the second recess forms the fourth recess having the sigma shaped cross-section.

8. The method of claim 6, further comprising:
    forming a first semiconductor pattern in the third recess; and
    forming a second semiconductor pattern in the fourth recess.

9. The method of claim 6, wherein:
    the etching the first recess forms the third recess having a third distance between the edge of the first recess and the first boundary surface between the first spacer and the first gate insulating layer, and a third depth from a top surface of the substrate, the etching the second recess forms the fourth recess having a fourth distance between the edge of the second recess and the second boundary surface between the second spacer and the second gate insulating layer, and a fourth depth from the top surface of the substrate, the third distance and the fourth distance being equal, and the third depth and the fourth depth being equal.

10. The method of claim 9, wherein the first distance is larger than the third distance.

11. The method of claim 1, further comprising:
cleansing the substrate before the etching sides of the plurality of first and second gate patterns.

12. The method of claim 11, wherein the substrate is a silicon substrate, and the cleansing the substrate further comprises removing a natural oxide film on the substrate.

* * * * *